US009035716B2

(12) United States Patent
Tanji et al.

(10) Patent No.: US 9,035,716 B2

(45) Date of Patent: May 19, 2015

(54) HIGH FREQUENCY SWITCH

(75) Inventors: Koki Tanji, Yokohama (JP); Tsuyoshi Sugiura, Yokohama (JP)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 424 days.

(21) Appl. No.: 13/355,225

(22) Filed: Jan. 20, 2012

(65) Prior Publication Data

US 2013/0187728 A1 Jul. 25, 2013

(51) Int. Cl.
*H01P 1/15* (2006.01)
*H03K 17/693* (2006.01)
*H04B 1/44* (2006.01)

(52) U.S. Cl.
CPC .......................................... *H01P 1/15* (2013.01)

(58) Field of Classification Search
CPC ........... H01P 1/10; H01P 1/15; H03K 17/687; H03K 17/693; H04B 1/44
USPC ...................... 333/101, 103; 327/427; 455/78
See application file for complete search history.

(56) References Cited

U.S. PATENT DOCUMENTS

| | | | | |
|---|---|---|---|---|
| 7,391,282 | B2 * | 6/2008 | Nakatsuka et al. | 333/103 |
| 7,843,280 | B2 * | 11/2010 | Ahn et al. | 333/103 |
| 7,890,063 | B2 * | 2/2011 | Ahn et al. | 455/78 |
| 8,385,876 | B2 * | 2/2013 | Goto et al. | 455/78 |
| 8,729,948 | B2 * | 5/2014 | Sugiura | 327/308 |
| 8,818,298 | B2 * | 8/2014 | Sugiura | 455/78 |
| 2010/0188163 | A1 | 7/2010 | Goto et al. | |
| 2011/0092179 | A1 | 4/2011 | Burgener et al. | |
| 2012/0154017 | A1 * | 6/2012 | Sugiura et al. | 327/409 |
| 2014/0009209 | A1 * | 1/2014 | Cebi et al. | 327/427 |
| 2014/0009212 | A1 * | 1/2014 | Altunkilic et al. | 327/427 |

FOREIGN PATENT DOCUMENTS

| | | | |
|---|---|---|---|
| JP | 2005-515657 | A | 5/2005 |
| JP | 2008011320 | A | 1/2008 |
| JP | 2009-500868 | A | 1/2009 |
| JP | 2010-178026 | A | 8/2010 |
| JP | 2012129813 | A * | 7/2012 |
| WO | WO 03/032431 | A3 | 4/2003 |
| WO | 2007/008934 | A1 | 1/2007 |

OTHER PUBLICATIONS

Chinese Office Action issued in Chinese Application No. 201210017976.0 dated Aug. 29, 2014, with English translation.
Japanese Office Action issued in Japanese Application No. 2010-279771 dated Apr. 30, 2014, w/English translation.

* cited by examiner

*Primary Examiner* — Dean Takaoka

(74) *Attorney, Agent, or Firm* — McDermott Will & Emery LLP

(57) ABSTRACT

There is provided a high frequency switch having a reduced circuit scale while maintaining satisfactory harmonic characteristics in a transfer path of a high frequency signal. The high frequency switch includes: at least one transmission port; at least one reception port; a common port; transmission side series switches each including a body contact type FET; transmission side shunt switches each including a body contact type FET; reception side series switches each including a body contact type FET; and reception side shunt switches each including at least one floating body type FET.

6 Claims, 2 Drawing Sheets

HIGH FREQUENCY SWITCH

BACKGROUND OF THE INVENTION

1. Field of the Invention

The present invention relates to a high frequency switch.

2. Description of the Related Art

Recently, the miniaturization of a wireless communications apparatus such as a mobile phone, or the like, has been rapidly undertaken. Since the wireless communications apparatus includes a plurality of semiconductor integrated circuits provided therein, it is very important to simplify or reduce these semiconductor integrated circuits in order to miniaturize the wireless communications apparatus. The semiconductor integrated circuit embedded in the wireless communications apparatus may include a high frequency semiconductor switch (hereinafter, referred to a high frequency switch) switching a high frequency signal transfer path between an antenna and transmission/reception circuits.

In a wireless communications system, the high frequency switch includes a plurality of high frequency ports connected to a plurality of transmission/reception circuits respectively and a common port connected to an antenna. The high frequency switch switches a high frequency signal transfer path between the plurality of high frequency ports and the common port, such that one of the plurality of transmission/reception circuits connected to the high frequency switch is selected to thereby be electrically connected to the antenna (See the following Patent Document 1). A high frequency switch disclosed in Patent Document 1 includes a plurality of metal oxide semiconductor field effect transistors (hereinafter, referred to as a MOSFETs) provided as a switching device on a silicon on insulation (SOI) substrate in order to switch a high frequency signal transfer path between each high frequency port and a common port. (Patent Document 1: Japanese Patent Laid-Open Publication No. 2005-515657)

SUMMARY OF THE INVENTION

An aspect of the present invention provides a high frequency switch having a reduced circuit scale while maintaining satisfactory harmonic characteristics in a high frequency signal transfer path using a metal oxide semiconductor field effect transistor (MOSFET) formed on a silicon on insulation (SOI) substrate.

According to an aspect of the present invention, there is provided a high frequency switch including: at least one transmission port inputting a transmission signal; at least one reception port outputting a reception signal; a common port transmitting the transmission signal or receiving the reception signal; transmission side series switches each including a body contact type field effect transistor (FET) and connected between the transmission port and the common port; transmission side shunt switches each including a body contact type FET and connected between the transmission port and a ground terminal; reception side series switches each including a body contact type FET and connected between the reception port and the common port; and reception side shunt switches each including at least one floating body type FET and connected between the reception port and a ground terminal.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Hereinafter, a high frequency switch according to an embodiment of the present invention will be described with reference to the accompanying drawings. The high frequency switch according to the embodiment of the present invention may be widely used in a high frequency switch for a wireless communications system such as a universal mobile telecommunications system (UMTS), a global system for mobile communications (GSM), or the like.

Embodiment

Figure 1:
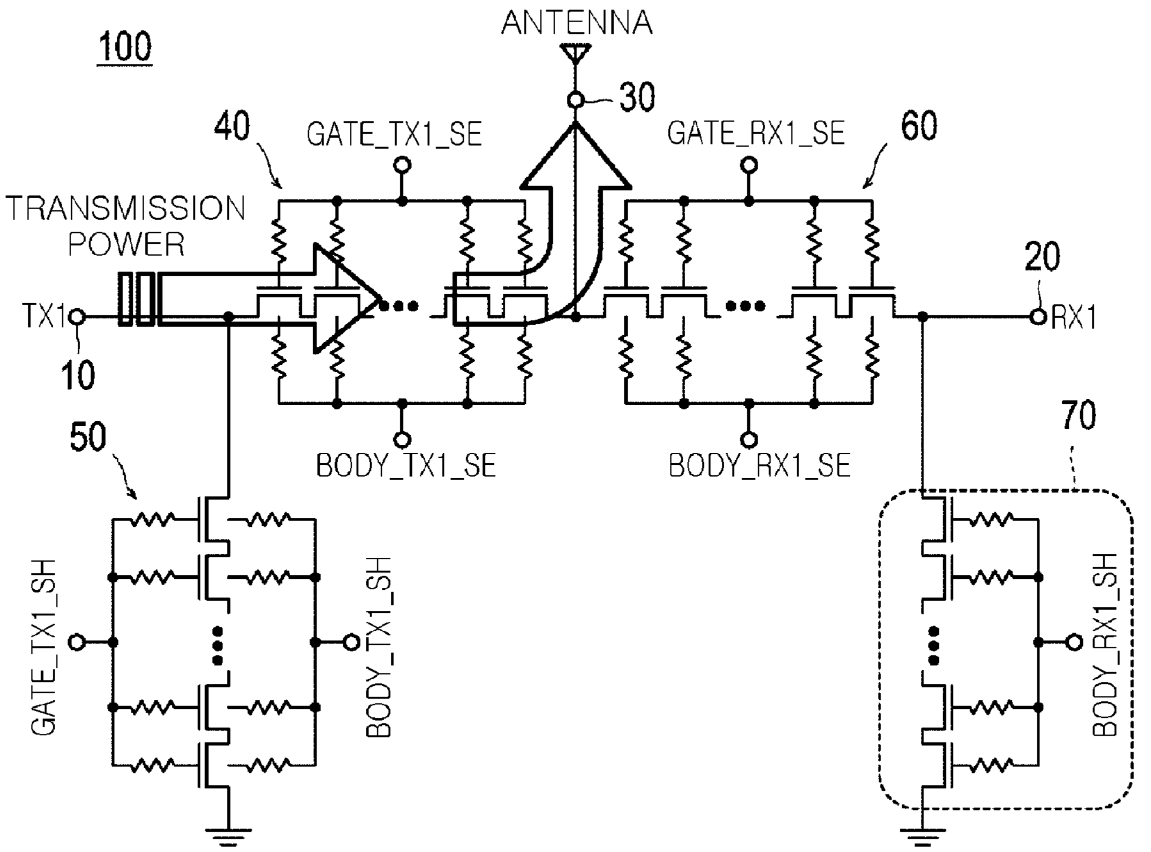
FIG. 1 is a circuit diagram of a high frequency switch according to an embodiment of the present invention.

FIG. 1 is a circuit diagram of a high frequency switch according to an embodiment of the present invention. In a high frequency switch circuit according to the embodiment, a FET having satisfactory harmonic characteristics with respect to high power is disposed in a portion in which a high frequency signal applied thereto has high power, and a FET having a small circuit scale and low insertion loss is disposed in a portion in which a high frequency signal applied thereto has low power.

As shown in FIG. 1, a high frequency switch 100 according to the embodiment may include a transmission port 10, a reception port 20, a common port 30, a transmission side series switch 40, a transmission side shunt switch 50, a reception side series switch 60, and a reception side shunt switch 70.

The transmission port 10 may be a port for inputting a transmission signal. The transmission port 10 may be connected to a signal input terminal of the transmission side series switch 40 and a signal input terminal of the transmission side shunt switch 50. The transmission signal transferred from a transmission circuit (not shown) may be transferred to the transmission side series switch 40 and the transmission side shunt switch 50 through the transmission port 10.

The reception port 20 may be a port for outputting a reception signal. The reception port 20 may be connected to a signal output terminal of the reception side series switch 60 and a signal input terminal of the reception side shunt switch 70. The reception signal from the reception side series switch 60 may be transferred to a reception circuit (not shown) through the reception port 20.

The common port 30 is a port for transmitting the transmission signal or receiving the reception signal. The common port 30 may be connected to a signal output terminal of the transmission side series switch 40 and the signal input terminal of the reception side series switch 50. In addition, according to the embodiment, the common port 30 may be connected directly to an antenna. However, the common port 30 may also be connected to the antenna through another component.

The transmission side series switch 40 may secure or block a transfer path of a high frequency signal between the transmission port 10 and the common port 30. The transmission side series switch 40 may include at least one body contact type FET and be connected between the transmission port 10 and the common port 30. The body contact type FET according to the embodiment may be an N-MOSFET formed by an SOI process. A structure and characteristics of the body contact type FET will be described below.

In addition, according to the embodiment, the transmission side series switch 40 may include a plurality of body contact type FETs having sources and drains connected in series with each other. Therefore, as shown in FIG. 1, when the transmission side series switch 40 is turned on, the transmission signal input from the transmission port 10 may be transferred to the antenna through the plurality of body contact type FETs of the transmission side series switch 40 connected in series with each other along a path indicated by an arrow. In addition, gates of the plurality of body contact type FETs may be connected to a control terminal GATE_TX1_SE controlling turn-on/off of the transmission side series switch 40 through respective gate resistors. The control terminal GATE_TX1_SE may have a small positive or negative voltage applied thereto.

In addition, the number of body contact type FETs included in the transmission side series switch 40 may be determined in consideration of electrical withstand voltage characteristics of the body contact type FET.

The transmission side shunt switch 50 may secure or block a transfer path of the high frequency signal between the transmission port 10 and a ground terminal. The transmission side shunt switch 50 may include at least one body contact type FET and be connected between the transmission port 10 and the ground terminal.

In addition, according to the embodiment, the transmission side shunt switch 50 may include a plurality of body contact type FETs having sources and drains connected in series with each other. Therefore, when the transmission side shunt switch is turned on, the transmission signal input from the transmission port 10 may be transferred to the ground terminal through the plurality of body contact type FETs of the transmission side shunt switch 50 connected in series with each other. As a result, unnecessary leakage power is absorbed in the ground terminal, such that isolation characteristics in a transmission side may be improved. In addition, gates of the plurality of body contact type FETs may be connected to a control terminal GATE_TX1_SH controlling turn-on/off of the transmission side shunt switch 50 through respective gate resistors. The control terminal GATE_TX1_SH may have a small positive or negative voltage applied thereto.

In addition, the number of body contact type FETs included in the transmission side shunt switch 50 may be determined in consideration of electrical withstand voltage characteristics of the body contact type FET.

The reception side series switch 60 may secure or block a transfer path of the high frequency signal between the reception port 20 and the common port 30. The reception side series switch 60 may include at least one body contact type FET and be connected between the reception port 20 and the common port 30.

In addition, according to the embodiment, the reception side series switch 60 may include a plurality of body contact type FETs having sources and drains connected in series with each other. Therefore, when the reception side series switch 60 is turned on, the reception signal input from the antenna may be transferred to the reception port 20 through the plurality of body contact type FETs of the reception side series switch 60 connected in series with each other. In addition, gates of the plurality of body contact type FETs may be connected to a control terminal GATE_RX1_SE controlling turn-on/off of the reception side series switch 60 through respective gate resistors. The control terminal GATE_RX1_SE may have a small positive or negative voltage applied thereto.

In addition, the number of body contact type FETs included in the reception side series switch 60 may be determined in consideration of electrical withstand voltage characteristics of the body contact type FET.

The reception side shunt switch 70 may secure or block a transfer path of the high frequency signal between the reception port 20 and a ground terminal. The reception side shunt switch 70 may include at least one floating body type FET and be connected to the reception port 20 and the ground terminal. The floating body type FET according to the embodiment may be an N-MOSFET formed by an SOI process. As shown in FIG. 1, since the floating body type FET has a small number of resistors and wirings, it has a scale smaller than that of the body contact type FET. Particularly, since a resistor used in the body contact type FET has a large resistance value, it occupies a wide area on a layout of a circuit. Therefore, in the reception side shunt switch 70, the floating body type FET is used instead of the body contact type FET, whereby a size of the circuit may be reduced. A structure and characteristics of the floating body type FET will be described below.

According to the embodiment shown in FIG. 1, the reception side shunt switch 70 includes a plurality of floating body type FETs having sources and drains connected in series with each other. Therefore, when the reception side shunt switch 70 is turned on, the reception signal input from the antenna may be connected to the ground terminal through the plurality of floating body type FETs of the reception side shunt switch 70 connected in series with each other. As a result, unnecessary leakage power is absorbed in the ground terminal, such that isolation characteristics in a reception side may be improved. In addition, gates of the plurality of floating body type FETs may be connected to a control terminal GATE_RX1_SH controlling turn-on/off of the reception side shunt switch 70 through gate resistors. The control terminal GATE_RX1_SH may have a small positive or negative voltage applied thereto.

In addition, the number of floating body type FETs included in the reception side shunt switch 70 may be determined in consideration of electrical withstand voltage characteristics of the floating body type FET.

Further, in view of reduction in a circuit scale, the body contact type FET may not be included in the reception side shunt switch 70. However, if needed, the body contact type FET may also be included in the reception side shunt switch 70.

Figure 2:
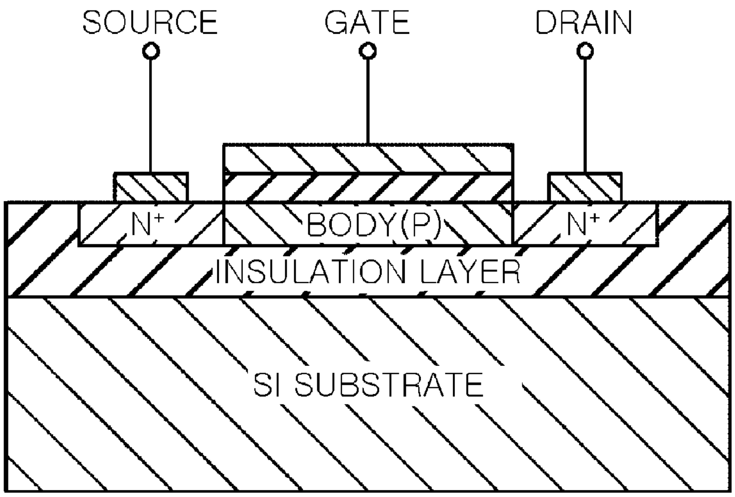
FIG. 2 is a cross-sectional view of a silicon on insulation field effect transistor (SOI FET) used in the high frequency switch according to the embodiment of the present invention.

Next, a structure and characteristics of an SOI FET used in the high frequency switch 100 according to the present invention will be described with reference to FIG. 2. FIG. 2 is a cross-sectional view of the SOI FET used in the high frequency switch 100 according to the present embodiment.

As shown in FIG. 2, the SOI FET according to the embodiment has a structure in which an insulation layer is stacked on a silicon (Si) substrate, and a body region and source and drain regions are formed on the insulation layer. Here, the insulation layer according to the embodiment may be formed of, for example, $SiO_2$. However, a material of the insulation layer is not limited to $SiO_2$.

In the SOI FET shown in FIG. 2, the floating body type FET may be formed by using a body in a floating state. Therefore, a resistor and a wiring are not installed on the body. Meanwhile, in the body contact type FET, a predetermined voltage may be applied to the body through a resistor and a wiring. For example, as shown in FIG. 1, a body terminal BODY_TX1_SE of the body contact type FET of the transmission side series switch 40 may have a predetermined small positive or negative voltage applied thereto. Applying a voltage to a body through a resistor is to reduce loss due to leakage power from the body.

On the other hand, in the floating body type FET, since the body is in a floated state, leakage power from the body is small, such that insertion loss is low. Meanwhile, the body contact FET has excellent harmonic characteristics with respect to a high power signal as compared to the floating body type FET. That is, the body contact type FET and the floating body type FET have a trade-off relationship therebetween, with respect to insertion loss characteristics and high power harmonic characteristics. Here, the high power signal means a signal having a power of approximately 35 dBm, for example.

As shown in FIG. 1, since the transmission side series switch 40 is provided on the transfer path of the transmission signal, the transmission side series switch 40 may have a high power signal applied thereto. Therefore, the transmission side series switch 40 needs to have satisfactory harmonic characteristics. In addition, since the transmission side shunt switch 50 and the reception side series switch 60 also have high power applied thereto, they need to have satisfactory harmonic characteristics in a state in which they are turned off.

Meanwhile, since the reception signal applied to the reception side shunt switch 70 has a power smaller than that of the transmission signal, even in the case in which the floating body type FET is used in the reception side shunt switch 70, a signal waveform is not distorted. On the contrary, with respect to a small power signal, since a turn-on resistance $R_{ON}$ of the floating body type FET is smaller than that of the body contact type FET, the floating body type FET has satisfactory harmonic characteristics. Therefore, the isolation characteristics in the reception side may be improved.

Therefore, according to the embodiment, each of the transmission side series switch 40, the transmission side shunt switch 50, and the reception side series switch 60 is configured to include at least one body contact type FET, and the reception side shunt switch 70 is configured to include at least one floating body type FET. Hereinafter, an operation of the high frequency switch 100 according to the embodiment configured as described above will be described.

As shown in FIG. 1, in the case in which the transmission signal is transmitted to the antenna, the transmission side series switch 40 and the reception side shunt switch 70 are turned on, and the transmission side shunt switch 50 and the reception side series switch 60 are turned off, by a control circuit (not shown).

Therefore, in the transmission side, the transfer path of the transmission signal between the transmission port 10 and the common port 30 may be secured through the transmission side series switch 40, and the transfer path of the transmission signal between the transmission port 10 and the ground terminal may be blocked. Here, since each of the transmission side series switch 40, the transmission side shunt switch 50, and the reception side series switch 60 includes at least one body contact type FET, harmonic characteristics in the transfer path of the transmission signal having high power may be maintained to be satisfactory.

Meanwhile, in the reception side, the transfer path of the reception signal between the common port 30 and the reception port 20 may be blocked, and the transfer path of the reception signal between the reception port 20 and the ground terminal may be secured, such that leakage power may be absorbed in the ground terminal.

In addition, in the case in which the reception signal is received from the antenna, the transmission side shunt switch 50 and the reception side series switch 60 are turned on, and the transmission side series switch 40 and the reception side shunt switch 70 are turned off, by a control circuit (not shown).

Therefore, in the reception side, the transfer path of the reception signal between the common port 30 and the reception port 20 may be secured through the reception side series switch 60. Here, since a small power signal received from the antenna is applied to the reception side shunt switch 70, harmonic characteristics in the transfer path of the reception signal may be maintained to be satisfactory.

Meanwhile, in the transmission side, the transfer path of the transmission signal between the transmission port 10 and the common port 30 may be blocked, and the transfer path of the transmission signal between the transmission port 10 and the ground terminal may be secured, such that leakage power may be absorbed in the ground terminal.

As described above, in the high frequency switch 100 according to the embodiment, since each of the transmission side series switch 40, the transmission side shunt switch 50, and the reception side series switch 60 includes the body contact type FET, harmonic characteristics of the high frequency signal in the transfer paths of the transmission and the reception signals may be satisfactory. In addition, since the reception side shunt switch 70 includes the floating body type FET, the circuit size of the high frequency switch 100 may be reduced. Therefore, in the high frequency switch 100 according to the embodiment, the circuit scale may be reduced while the harmonic characteristics in the transfer path of the high frequency signal may be maintained to be satisfactory.

Modified Embodiment

In the foregoing embodiment described above, a case in which a high frequency switch includes a single transmission port and a single reception port has been described. Hereinafter, as a modified embodiment of the foregoing embodiment, a case in which a high frequency switch includes a plurality of transmission ports, a plurality of reception ports, and a plurality of transmission and reception ports will be described with reference to FIG. 3. Since the modified embodiment of the foregoing embodiment has the same configuration as that of the foregoing embodiment described above, except that the high frequency switch includes the plurality of transmission ports, the plurality of reception ports, and the plurality of transmission and reception ports, a description overlapping with that of the foregoing embodiment described above will be omitted.

Figure 3:
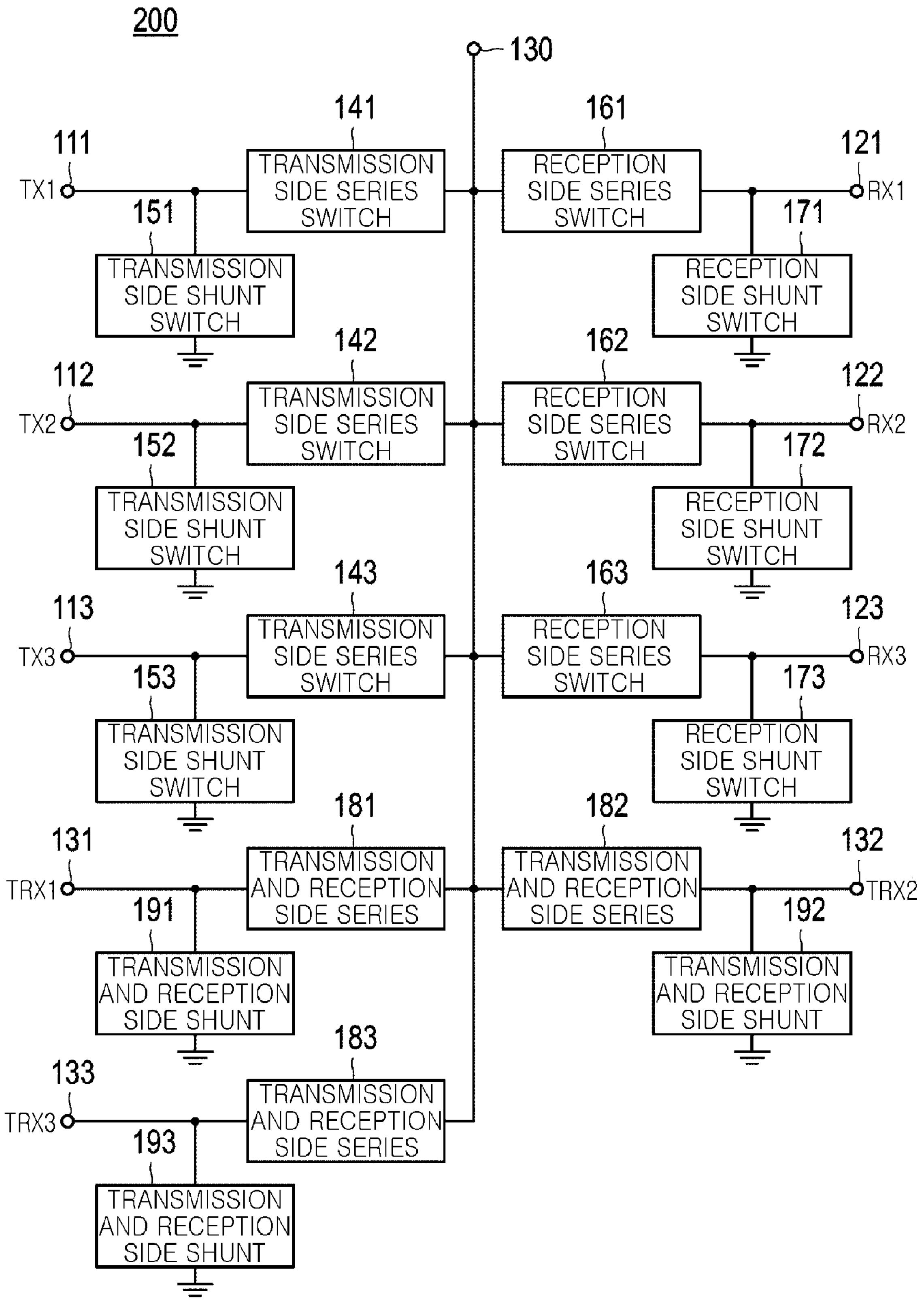
FIG. 3 is a schematic block diagram of a high frequency switch according to a modified embodiment of the embodiment of the present invention.

FIG. 3 is a schematic block diagram of a high frequency switch according to a modified embodiment of the embodiment of the present invention. As shown in FIG. 3, a high frequency switch 200 according to the modified embodiment may include transmission ports 111 to 113, reception ports 121 to 123 and transmission and reception ports 131 to 133. Respective transmission side series switches 141 to 143 may be provided between the respective transmission ports 111 to 113 and the common port 130. Respective transmission side shunt switches 151 to 153 may be provided between the respective transmission ports 111 to 113 and a ground terminal.

In addition, respective reception side series switches 161 to 163 may be provided between the respective reception ports 121 to 123 and the common port 130. Respective reception side shunt switches 171 to 173 may be provided between the respective reception ports 121 to 123 and a ground terminal.

In addition, respective transmission and reception side series switches 181 to 183 may be provided between the respective transmission and reception ports 131 to 133 and the common port 130. Respective reception side shunt switches 191 to 193 may be provided between the respective transmission and reception ports 131 to 133 and the ground terminal.

According to the modified embodiment, each of the transmission side series switches 141 to 143, the transmission side shunt switches 151 to 153, the reception side series switches 161 to 163, the transmission and reception side series switches 181 to 183, and the transmission and reception side shunt switches 191 to 193 may include at least one body contact type FET. Meanwhile, each of the reception side shunt switches 171 to 173 may include at least one floating body type FET. Hereinafter, an operation of the high frequency switch according to the modified embodiment will be described.

First, with respect to an operation when a transmission signal is transmitted, a case in which a transmission signal input to the transmission port 111 is transmitted will be described by way of example.

In the case in which the transmission signal input to the transmission port 111 is transmitted, the transmission side series switch 141 connected between the transmission port 111 and common port 130 may be turned on, and the transmission side shunt switch 151 connected between the transmission port 111 and the ground terminal may be turned off.

In addition, the remainder transmission side series switches 142 and 143 other than the transmission side series switch 141, all of the reception side series switches 161 to 163, and all of the transmission and reception side series switches 181 to 183 may be turned off.

Further, the remainder transmission side shunt switches 152 and 153 other than the transmission side shunt switch 151, all of the reception side shunt switches 171 to 173, and all of the transmission and reception side shunt switches 191 to 193 may be turned off.

Therefore, with respect to the transmission port 111, a transfer path of the transmission signal between the transmission port 111 and the common port 130 may be secured through the transmission side series switch 141, and a transfer path of the transmission signal between the transmission port 111 and the ground terminal may be blocked. Meanwhile, with respect to the remainder transmission ports, all of the reception ports, and all of the transmission and reception ports, a transfer path of the signal between each of them and the common port 130 may be blocked, and a transfer path of the signal between each of them and the ground terminal may be secured, such that leakage power may be absorbed in the ground terminal.

Next, with respect to an operation when a reception signal is received, a case in which a reception signal to be output is received through the reception port 121 will be described by way of example.

The reception side series switch 161 connected between the reception port 121 outputting the reception signal and the common port 130 may be turned on, and the reception side shunt switch 171 connected between the reception port 121 and the ground terminal may be turned off.

In addition, the remainder reception side series switches 162 and 163 other than the reception side series switch 161, all of the transmission side series switches 141 to 143, and all of the transmission and reception side series switches 181 to 183 may be turned off.

Further, the remainder reception side shunt switches 172 and 173 other than the reception side shunt switch 171, all of the transmission side shunt switches 151 to 153, and all of the transmission and reception side shunt switches 191 to 193 may be turned on.

Therefore, with respect to the reception port 121, a transfer path of the reception signal between the receive port 121 and the common port 130 may be secured through the receive side series switch 161, and a transfer path of the reception signal between the reception port 121 and the ground terminal may be blocked. Meanwhile, with respect to all of the transmission ports, the remainder reception ports, and all of the transmission and reception ports, a transfer path of the signal between each of them and the common port 130 may be blocked, and a transfer path of the signal between each of them and the ground terminal may be secured, such that leakage power may be absorbed in the ground terminal.

The embodiment described above has the following effects.

(a) With the high frequency switch according to the embodiment, each of the transmission side series switch, the transmission side shunt switch, and the reception series switch may include at least one body contact type FET, and the reception side shunt switch may include at least one floating body type FET. Therefore, the size of the circuit may be reduced while the harmonic characteristics in the transfer path of the high frequency signal may be maintained to be satisfactory. In addition, the isolation characteristics in the reception side may be improved.

(b) The reception side shunt switch may include a plurality of floating body type FETs having sources and drains connected in series with each other. Therefore, the transfer path of the high frequency signal from the reception port to the ground terminal may be secured, such that the unnecessary leakage power is absorbed in the ground terminal, whereby the isolation characteristics in the reception side may be improved.

As described above, the high frequency switch according to the embodiments of the present invention has been described. However, it is obvious that addition, modification, and omission may be appropriately made by those skilled in the art from departing from the sprit and scope of the present invention.

For example, in the embodiments, the case in which a single transmission port and a single reception port are provided and the case in which three transmission ports, three reception ports, and three transmission and reception ports are provided have been described. However, the number of each of the transmission ports, reception ports, and transmission and reception ports is not limited thereto.

As set forth above, with the high frequency switch according to the embodiment of the present invention, the size of the circuit can be reduced while the harmonic characteristics in the transfer path of the high frequency signal are maintained to be satisfactory. In addition, the isolation characteristics in the reception side can be improved.

What is claimed is:

1. A high frequency switch comprising:

at least one transmission port inputting a transmission signal;

at least one reception port outputting a reception signal;

a common port transmitting the transmission signal or receiving the reception signal;

transmission side series switches each including a body contact type field effect transistor (FET) and connected between the transmission port and the common port;

transmission side shunt switches each including a body contact type FET and connected between the transmission port and a ground terminal;

reception side series switches each including a body contact type FET and connected between the reception port and the common port; and reception side shunt switches each including at least one floating body type FET and connected between the reception port and a ground terminal.

2. The high frequency switch of claim 1, wherein the floating body type FET of each reception side shunt switch includes a plurality of floating body type FETs having sources and drains connected in series with each other, such that a transfer path of a high frequency signal from the reception port to the ground terminal is secured.

3. The high frequency switch of claim 1, wherein when the transmission signal is transmitted, a transmission side series switch connected between the transmission port inputting the transmission signal and the common port among the transmission side series switches is turned on, a transmission side shunt switch connected between the transmission port and the ground terminal among the transmission side shunt switches is turned off, the remainder transmission side series switches, other than the transmission side series switch and all of the reception side series switches are turned off, and the remainder transmission side shunt switches, other than the transmission side shunt switch and all of the reception side shunt switches are turned on, and when the reception signal is received, a reception side series switch connected between the reception port outputting the reception signal and the common port among the reception side series switches is turned on, a reception side shunt switch connected between the reception port and the ground terminal among the reception side shunt switch is turned off, the remainder reception side series switches, other than the reception side series switch and all of the transmission side series switches are turned off, and the remainder reception side shunt switches, other than the reception side shunt switch and all of the transmission side shunt switches are turned on.

4. The high frequency switch of any one of claim 1, wherein the common port is connected to an antenna.

5. The high frequency switch of any one of claim 2, wherein the common port is connected to an antenna.

6. The high frequency switch of any one of claim 3, wherein the common port is connected to an antenna.

* * * * *